(12) United States Patent
Watanabe et al.

(10) Patent No.: US 8,129,998 B2
(45) Date of Patent: Mar. 6, 2012

(54) PERFORMANCE DEGRADATION ANALYZER AND METHOD OF THE SAME

(75) Inventors: Nobuo Watanabe, Susono (JP); Nobuyuki Kitamura, Minamitsuru-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 1064 days.

(21) Appl. No.: 11/990,128

(22) PCT Filed: Aug. 7, 2006

(86) PCT No.: PCT/JP2006/315971
§ 371 (c)(1),
(2), (4) Date: Feb. 7, 2008

(87) PCT Pub. No.: WO2007/018294
PCT Pub. Date: Feb. 15, 2007

(65) Prior Publication Data
US 2010/0141262 A1    Jun. 10, 2010

(30) Foreign Application Priority Data
Aug. 9, 2005 (JP) .................. 2005-230814

(51) Int. Cl.
G01N 27/416    (2006.01)
(52) U.S. Cl. ..................... 324/430; 429/13; 324/433

(58) Field of Classification Search ........... 320/426–436
See application file for complete search history.

(56) References Cited

U.S. PATENT DOCUMENTS
2007/0172708 A1 *  7/2007  Takebe et al. .................. 429/13

FOREIGN PATENT DOCUMENTS

| JP | 2002-367650 A | 12/2002 |
|---|---|---|
| JP | 2002-367657 A | 12/2002 |
| JP | 2003-14796 A | 1/2003 |
| JP | 2003-317810 A | 11/2003 |
| JP | 2004-152532 A | 5/2004 |
| JP | 2005-44715 A | 2/2005 |
| JP | 2005-71882 A | 3/2005 |
| JP | 2005-332702 A | 12/2005 |
| JP | 2007-12419 A | 1/2007 |
| WO | WO 2005/088753 A1 | 9/2005 |
| WO | WO 2006/056076 A1 | 6/2006 |

* cited by examiner

*Primary Examiner* — Samuel Berhanu
(74) *Attorney, Agent, or Firm* — Kenyon & Kenyon LLP

(57) ABSTRACT

An AC impedance meter measures an AC impedance of fuel cells against at least a specific frequency. A sensor group detects at least one operating condition of the fuel cells. A detection unit compares a degradation reference value corresponding to the detected operating condition with a resistance value led from the measured AC impedance and detects performance degradation in the fuel cells based on a result of the comparison. This arrangement enables easy detection of performance degradation in the fuel cells, irrespective of a variation in operating condition of the fuel cells.

14 Claims, 14 Drawing Sheets

PERFORMANCE DEGRADATION ANALYZER AND METHOD OF THE SAME

This is a 371 national phase application of PCT/JP2006/315971 filed 7 Aug. 2006, which claims priority of Japanese Patent Application No. 2005-230814 filed 9 Aug. 2005, the contents of which are incorporated herein by reference.

TECHNICAL FIELD

The present invention relates to a technique of detecting performance degradation of fuel cells.

BACKGROUND ART

One known method of detecting an abnormality occurring in fuel cells utilizes an AC impedance of the fuel cells as disclosed in, for example, Japanese Patent Laid-Open No. 2002-367650.

This prior art method measures in advance an AC impedance of a polymer electrolyte fuel cell or a fuel cell stack at a specific frequency in the state of normal power generation and sets the measured AC impedance to a reference impedance value. The method then measures the AC impedance of the fuel cell or the fuel cell stack at the specific frequency during power generation and compares the measured AC impedance with the reference impedance value. When a difference between the measured AC impedance and the reference impedance value exceeds a preset allowable limit, it is determined that some abnormality arises in the fuel cell or the fuel cell stack. A diffusion resistance (concentration polarization) of the fuel cell is specified by an imaginary part of an AC impedance measured at a frequency of 5 Hz. A reaction resistance of the fuel cell is specified by an imaginary part of an AC impedance measured at a frequency of 40 Hz. An ohmic resistance of the fuel cell is specified by a real part of the AC impedance measured at the frequency of 5 Hz.

The AC impedance of the fuel cell is varied not only by performance degradation in the fuel cell but may also be varied even in the normal state with a variation in operating conditions of the fuel cell. In application of fuel cells as an energy supply source of a vehicle, the operating conditions of the fuel cells (for example, the temperature and the power output) significantly vary with a variation in driving state of the vehicle. This leads to a significant variation in AC impedance.

There may be a difficulty in identifying the cause of a large difference between the measured AC impedance and the reference impedance value exceeding the preset allowable limit between the variation of the AC impedance due to the occurrence of some abnormality (performance degradation) in the fuel cell or the fuel cell stack and the variation of the AC impedance due to a variation in operating conditions of the fuel cell.

For example, the reaction resistance in the fuel cell may be increased by degradation of the catalytic activity as well as a temporary decrease of the catalytic activity based on a temperature decrease. The prior art method can not discriminate the performance degradation (abnormality) from the simple temporary performance decrease. The similar difficulties arise for the diffusion resistance and the ohmic resistance.

In the specification hereof, the terminology 'performance degradation' means permanent and fatal performance decrease, whereas the terminology 'temporary performance decrease' means only temporal performance decrease with a potential for recovery of performance in some conditions.

DISCLOSURE OF THE INVENTION

There would thus be a demand for a technique of enabling easy detection of performance degradation in a fuel cell, irrespective of a variation in operating state of the fuel cell.

In order to accomplish at least part of the above and other related demands, one aspect of the invention pertains to a performance degradation analyzer of detecting performance degradation in a fuel cell. The performance degradation analyzer includes: an AC impedance meter configured to measure an AC impedance of the fuel cell against at least a specific frequency; an operating state sensor configured to detect an operating state of the fuel cell; and a detector configured to compare a degradation reference value corresponding to the detected operating state with a value led from the measured AC impedance and detects performance degradation in the fuel cell based on a result of the comparison.

In the performance degradation analyzer according to one aspect of the invention, even in the event of a variation in operating state of the fuel cell, the detector compares the degradation reference value corresponding to the operating state detected by the operating state sensor with the value led from the measured AC impedance and detects performance degradation in the fuel cell based on the comparison result.

The performance degradation analyzer according to this aspect of the invention uses the suitable degradation reference value corresponding to the varying operating state to be compared with the value led from the measured AC impedance. The performance degradation analyzer of the invention thus enables easy detection of performance degradation in the fuel cell, irrespective of a variation in operating state of the fuel cell. This arrangement distinctly discriminate a performance degradation from a simple temporary performance decrease caused by a variation in operating state of the fuel cell, thus ensuring early detection of performance degradation in the fuel cell.

In one preferable application of the performance degradation analyzer according to the above aspect of the invention, the specific frequency is a frequency suitable for measurement of an ohmic resistance in the fuel cell. The operating state sensor detects at least a moisture state of an electrolyte membrane included in the fuel cell, as the operating state of the fuel cell. The value led from the measured AC impedance is an ohmic resistance value of the fuel cell.

The value of the ohmic resistance is generally increased by degradation of separators and an electrolyte membrane in the fuel cell. The performance degradation analyzer of this arrangement thus enables easy detection of performance degradation based on the ohmic resistance to identify the occurrence of degradation in the separators and the electrolyte membrane in the fuel cell.

In the performance degradation analyzer of the invention, it is preferable that the degradation reference value is set to be higher in a drier state of the electrolyte membrane.

The value of the ohmic resistance increases in the drier state of the electrolyte membrane. The larger degradation reference value is thus required for accurate detection of performance degradation in the fuel cell.

In one preferable embodiment of the performance degradation analyzer according to the above aspect of the invention, the specific frequency is a frequency suitable for measurement of an ohmic resistance in the fuel cell. The operating state sensor detects at least one of an internal temperature of the fuel cell and a humidification amount of a gas supplied to the fuel cell, as the operating state of the fuel cell. The value led from the measured AC impedance is an ohmic resistance value of the fuel cell.

This arrangement accurately specifies the moisture state of the electrolyte membrane and thus enables easy detection of performance degradation based on the ohmic resistance to identify the occurrence of degradation in the separators and the electrolyte membrane in the fuel cell.

In another preferable application of the performance degradation analyzer according to the above aspect of the invention, the specific frequency is a frequency suitable for measurement of a reaction resistance in the fuel cell. The operating state sensor detects at least a catalytic activity in the fuel cell, as the operating state of the fuel cell. The value led from the measured AC impedance is a reaction resistance value of the fuel cell. The degradation reference value is set to increase with a decrease in catalytic activity.

The value of the reaction resistance is generally increased by degradation of the catalytic activity in the fuel cell. The performance degradation analyzer of this arrangement thus enables easy detection of performance degradation based on the reaction resistance to identify the occurrence of degradation of the catalytic activity in the fuel cell.

The value of the reaction resistance increases with a decrease in catalytic activity. The larger degradation reference value is thus required for accurate detection of performance degradation in the fuel cell.

In another preferable embodiment of the performance degradation analyzer according to the above aspect of the invention, the specific frequency is a frequency suitable for measurement of a reaction resistance in the fuel cell. The operating state sensor detects at least one of an internal temperature of the fuel cell, a pressure of a gas supplied to the fuel cell, and a power generation current of the fuel cell, as the operating state of the fuel cell. The value led from the measured AC impedance is a reaction resistance value of the fuel cell.

This arrangement accurately specifies the catalytic activity and thus enables easy detection of performance degradation based on the reaction resistance to identify the occurrence of degradation of the catalytic activity in the fuel cell.

In still another preferable application of the performance degradation analyzer according to the above aspect of the invention, the specific frequency is a frequency suitable for measurement of a diffusion resistance in the fuel cell. The operating state sensor detects at least a gas diffusion state in the fuel cell, as the operating state of the fuel cell. The value led from the measured AC impedance is a diffusion resistance value of the fuel cell. The degradation reference value is set to increase with a decrease in gas diffusion state.

The value of the diffusion resistance is generally increased by degradation of a diffusion layer included in the fuel cell. The performance degradation analyzer of this arrangement thus enables easy detection of performance degradation based on the diffusion resistance to identify the occurrence of degradation of the diffusion layer in the fuel cell.

The value of the diffusion resistance increases with a decrease in gas diffusion state. The larger degradation reference value is thus required for accurate detection of performance degradation in the fuel cell.

In still another preferable embodiment of the performance degradation analyzer according to the above aspect of the invention, the specific frequency is a frequency suitable for measurement of a diffusion resistance in the fuel cell. The operating state sensor detects at least one of a flow rate of the air supplied to the fuel cell, a humidification amount of the air, and a power generation current of the fuel cell, as the operating state of the fuel cell. The value led from the measured AC impedance is a diffusion resistance value of the fuel cell.

This arrangement accurately specifies the gas diffusion state and thus enables easy detection of performance degradation based on the diffusion resistance to identify the occurrence of degradation of the diffusion layer in the fuel cell.

In the performance degradation analyzer of the invention, the value led from the measured AC impedance may be an internal resistance value of the fuel cell.

The use of the internal resistance enables overall detection of performance degradation in the fuel cell.

The technique of the invention is not restricted to the performance degradation analyzer having any of the arrangements described above but may be a detection unit adopted in the performance degradation analyzer, as well as a performance degradation detection method having any of the corresponding configurations.

BEST MODES OF CARRYING OUT THE INVENTION

Some modes of carrying out the invention are described below with reference to the accompanied drawings in the following sequence:

A. System Configuration of Embodiment
B. AC Impedance and Internal Resistance in Fuel Cells
C. Principle of Performance Degradation Detection
D. Performance Degradation Detection Based on Ohmic Resistance
E. Performance Degradation Detection Based on Reaction Resistance F. Performance Degradation Detection Based on Diffusion Resistance
G. Advantages of Embodiment
H. Other Aspects
  H-1. Modified Example 1
  H-2. Modified Example 2
  H-3. Modified Example 3

A. System Configuration of Embodiment

Figure 1:
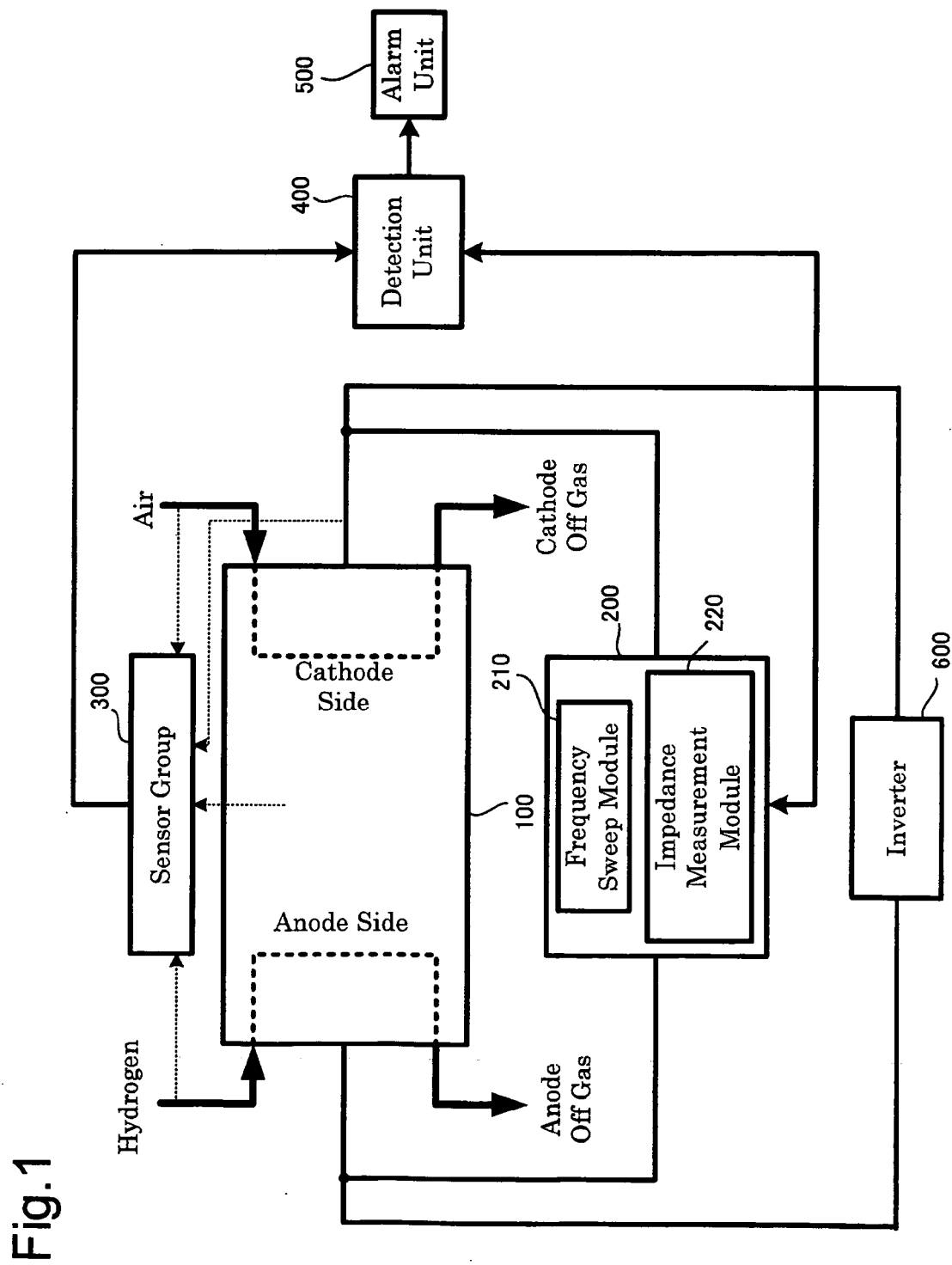
FIG. 1 is a block diagram showing a fuel cell performance degradation analyzer according to one embodiment of the invention.

FIG. 1 is a block diagram showing a fuel cell performance degradation analyzer according to one embodiment of the invention. As illustrated in FIG. 1, fuel cells 100 are mounted, together with the fuel cell performance degradation analyzer, on a vehicle (not shown) and are connected via an inverter 600 to a motor (not shown) that gives driving power to the vehicle. The fuel cells 100 have a stack structure formed by a number of unit cells that generate electric power through an electrochemical reaction of hydrogen with oxygen. Each unit cell has a membrane electrode assembly (not shown) and a pair of separators (not shown) arranged across the membrane electrode assembly. The membrane electrode assembly includes a proton-conductive electrolyte membrane (not shown) and an anode and a cathode (not shown) that both consist of a diffusion layer and a catalyst layer and are formed on opposed faces of the proton-conductive electrolyte membrane. In the structure of this embodiment, the electrolyte membrane is a solid polymer membrane and is humidified to keep the adequate level of proton conductivity.

The fuel cell performance degradation analyzer includes an AC impedance meter 200, a sensor group 300, a detection unit 400, and an alarm unit 500. The AC impedance meter 200 includes a frequency sweep module 210 and an impedance measurement module 220 and is connected with both an anode side and a cathode side of the fuel cells 100 as well as with the detection unit 400. The sensor group 300 includes multiple sensors that are arranged inside and outside of the fuel cells 100 and are respectively connected to the detection unit 400 as described later.

The AC impedance meter 200, the sensor group 300, and the detection unit 400 of the embodiment are respectively equivalent to the AC impedance meter, the operating state sensor, and the detector or detection unit of the invention.

Figure 2:
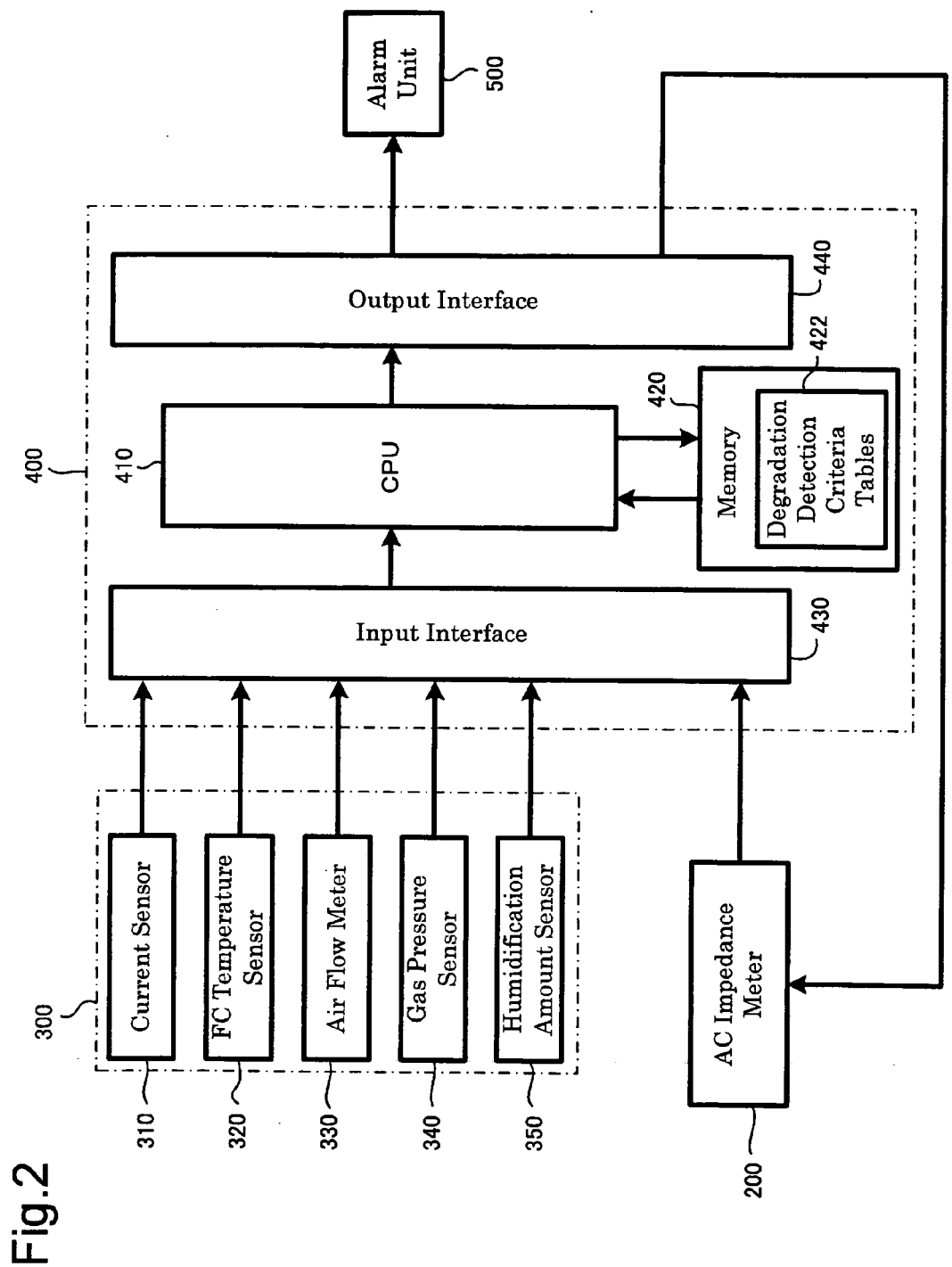
FIG. 2 is a block diagram showing the structure of a sensor group 300 and a detection unit 400 of FIG. 1.

FIG. 2 is a block diagram showing the structure of the sensor group 300 and the detection unit 400 of FIG. 1. As shown in FIG. 2, the sensor group 300 includes a current sensor 310 that measures a power generation current of the fuel cells 100, an FC temperature sensor 320 that measures the internal temperature of the fuel cells 100 or more specifically the temperature of cooling water in the fuel cells 100 as an FC temperature, an air flow meter 330 that measures the flow rate of the air supplied to the cathodes of the fuel cells 100, a gas pressure sensor 340 that measures the pressure of the gas (hydrogen or the air) supplied to the fuel cells 100, and a humidification amount sensor 350 that measures a humidification amount of the reactive gas (hydrogen or the air) supplied to the fuel cells 100.

The detection unit 400 includes a CPU 410 that performs diversity of processes, computations, determinations, and controls, a memory 420 that stores degradation detection criteria tables 422 described later, an input interface 430 that inputs a measurement output of the AC impedance meter 200 and measurement outputs of the sensor group 300 and transfer the input data to the CPU 410, and an output interface 440 that transmits alarm instructions given by the CPU 410 to the alarm unit 500 and transmits control instructions given by the CPU 410 to the AC impedance meter 200.

B. AC Impedance and Internal Resistance in Fuel Cells

Prior to description of the operations characteristic of the embodiment, the correlation of the AC impedance to the internal resistance in the fuel cells 100 is explained.

The internal resistance of the fuel cells 100 is expressed as the sum of an ohmic resistance, a reaction resistance, and a diffusion resistance:

Internal Resistance=Ohmic Resistance+Reaction Resistance+Diffusion Resistance

The ohmic resistance represents a total direct current resistance of the separators and the electrolyte membranes of the fuel cells and follows the Ohm's Law.

The reaction resistance is caused by a catalytic chemical reaction. In the fuel cells of the embodiment using the highly pure hydrogen and the air as reactive gases, the cathode (air electrode) has a large reaction resistance (voltage drop) due to the reaction of $O_2+4e^-\rightarrow 2O^{2-}$, while the anode (hydrogen electrode) has a negligibly small reaction resistance.

The diffusion resistance is caused by a difficulty in reach of an active material to the catalyst. In the fuel cells of the embodiment using the high pure hydrogen and the air as reactive gases, as the supplied air has the component ratio of $O_2:N_2=21:79$, oxygen $O_2$ is consumed on the cathode (air electrode) to have difficulty in reach to the surface of the catalyst. This leads to a large diffusion resistance. On the cathode (air electrode), water $H_2O$ is produced by the reaction of $2H_2+O_2\rightarrow 2H_2O$. The produced water interferes with diffusion of the oxygen $O_2$ and thereby increases the diffusion resistance. On the anode (hydrogen electrode), on the other hand, since the purity of the supplied hydrogen $H_2$ is substantially equal to 100%, the diffusion resistance is negligibly small.

Figure 3:
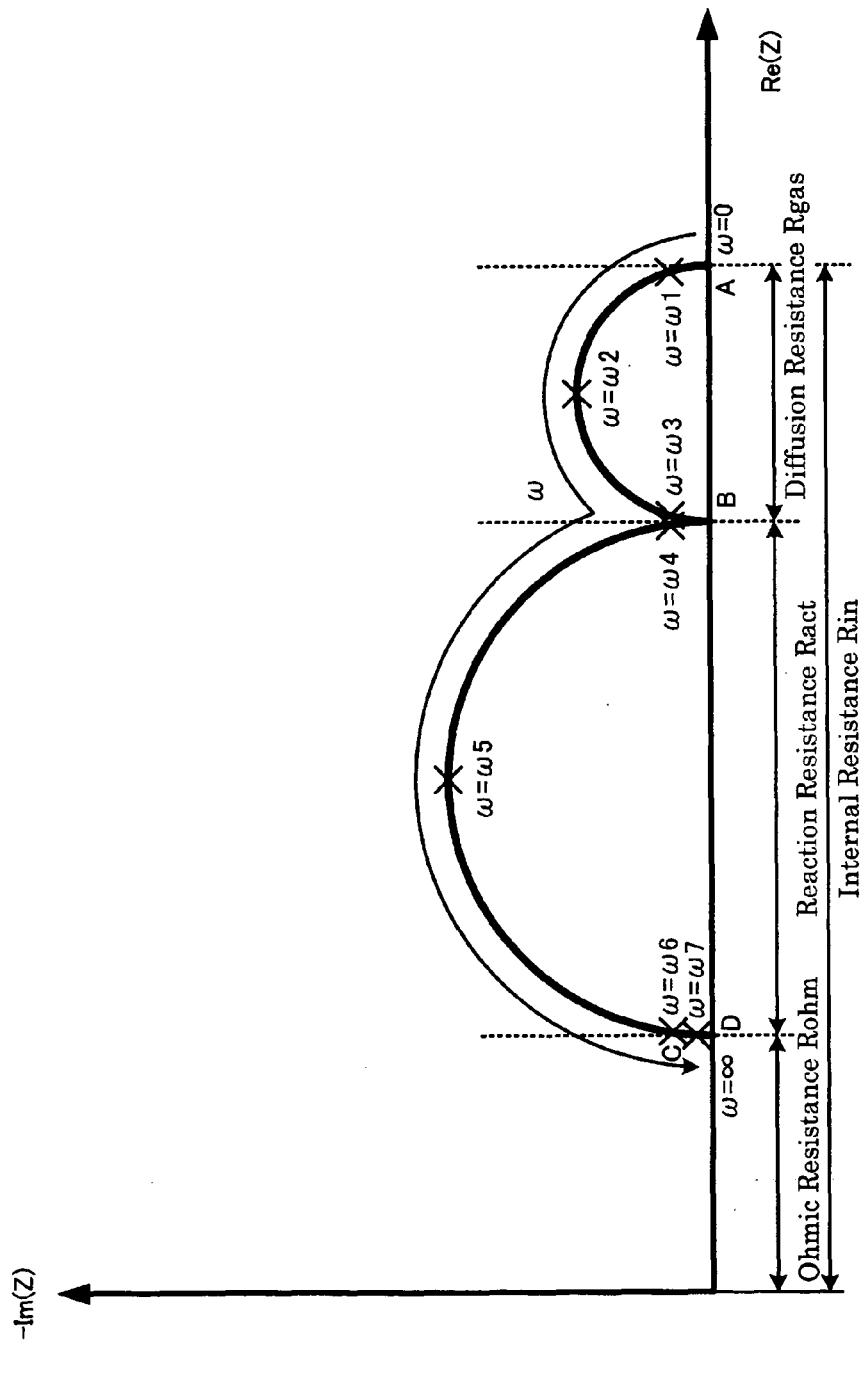
FIG. 3 shows a correlation of AC impedance to internal resistance in fuel cells.

The AC impedance of the fuel cells generally draws a locus shown in FIG. 3 on a complex plane by frequency sweep.

FIG. 3 shows a correlation of AC impedance to internal resistance in the fuel cells. In the graph of FIG. 3, the abscissa denotes a real part $Re(Z)$ of an AC impedance Z, and the ordinate denotes an imaginary part $-Im(Z)$ of the AC impedance Z. Sweeping a frequency $\omega$ from 0 to infinite $\infty$ causes the AC impedance of the fuel cells to draw a small semicircular arc and a large semicircular arc as shown in FIG. 3. The value of the AC impedance is located at one end A of the small semicircular arc at the frequency $\omega$ of 0 Hz ($\omega=0$) and moves from the end A to the vicinity of an end B at the contact between the small semicircular arc and the large semicircular arc with a variation of the frequency $\omega$ in the range of not higher than several ten Hz (for example, $\omega=\omega 1, \omega 2, \omega 3$). The value of the AC impedance further moves from the vicinity of the end B to the vicinity of a peripheral point C of the large semicircular arc with a variation of the frequency $\omega$ in the range of several ten Hz to several hundred Hz (for example, $\omega=\omega 4, \omega 5, \omega 6$), and then moves from the vicinity of the peripheral point C to the vicinity of an end D of the large semicircular arc with a variation of the frequency $\omega$ of not lower than 1 kHz (for example, $\omega=\omega 7$).

There is the following relation between the AC impedance and the internal resistance in the fuel cells. The distance of the real part $Re(Z)$ of the AC impedance Z from an origin of the complex plane to one end ($\omega=\infty$) of the large semicircular arc corresponds to the value of an ohmic resistance Rohm of the fuel cells. The distance of the real part $Re(Z)$ from one end ($\omega=\infty$) to the other end of the large semicircular arc corresponds to the value of a reaction resistance Ract of the fuel cells. The distance of the real part Re(Z) from one end to the other end ($\omega=0$) of the small semicircular arc corresponds to the value of a diffusion resistance Rgas of the fuel cells. The sum of the ohmic resistance Rohm, the reaction resistance Ract, and the diffusion resistance Rgas is equal to an internal resistance Rin of the fuel cells.

Measurement of the AC impedance in the fuel cells 100 thus determines the values of the ohmic resistance Rohm, the reaction resistance Ract, and the diffusion resistance Rgas constituting the internal resistance Rin of the fuel cells 100.

The ohmic resistance, the reaction resistance, and the diffusion resistance respectively correspond to the frequency of not lower than 500 Hz, the frequency in the range of 5 to 500 Hz, and the frequency of not higher than 5 Hz.

C. Principle of Performance Degradation Detection

The ohmic resistance Rohm, the reaction resistance Ract, and the diffusion resistance Rgas may be increased by the performance degradation of the fuel cells 100. More specifically the ohmic resistance Rohm is increased by degradation of the separators and the electrolyte membranes, the reaction resistance Ract is increased by degradation of the catalytic activity, and the diffusion resistance Rgas is increased by degradation of the diffusion layers.

The procedure of performance degradation detection measures the AC impedance of the fuel cells 100 and determines the values of the ohmic resistance Rohm, the reaction resistance Ract, and the diffusion resistance Rgas. Detecting which of these resistances Rohm, Ract, and Rgas has an increase identifies the location of performance degradation in the fuel cells 100.

The ohmic resistance Rohm, the reaction resistance Ract, and the diffusion resistance Rgas may, however, be also varied according to the operating conditions of the fuel cells 100. Even in the normal state of the fuel cells 100 (with no performance degradation), the fuel cells 100 may have a temporary performance decrease in some operating conditions of the fuel cells 100 to increase the ohmic resistance Rohm, the reaction resistance Ract, or the diffusion resistance Rgas.

Like the drawback of the prior art described previously, simple detection of an increase in value of the resistance can not discriminate the performance degradation from the temporary performance decrease.

The procedure of the embodiment sets in advance degradation detection criteria for the ohmic resistance Rohm, the reaction resistance Ract, and the diffusion resistance Rgas with regard to each set of various operating conditions of the fuel cells 100. The procedure measures the AC impedance of the fuel cells 100 and determines the values of the ohmic resistance Rohm, the reaction resistance Ract, and the diffusion resistance Rgas, while detecting the operating conditions of the fuel cells 100 and specifying the settings of the degradation detection criteria corresponding to the detected operating conditions. The procedure then compares the specified settings of the degradation detection criteria with the determined values of the respective resistances and detects the occurrence of performance degradation when any of the resistances exceeds the corresponding degradation detection criterion.

The performance degradation detection based on the ohmic resistance Rohm, the performance degradation detection based on the reaction resistance Ract, and the performance degradation detection based on the diffusion resistance Rgas are sequentially explained below.

D. Performance Degradation Detection Based on Ohmic Resistance

The ohmic resistance is thought to be the total direct current resistance of the separators and the electrolyte membranes in the fuel cells 100. The direct current resistance of the electrolyte membrane depends upon the proton conductivity of the electrolyte membrane and affects the performance of the fuel cells 100. The proton conductivity is higher at the higher temperature of the electrolyte membrane and is lower at the lower temperature of the electrolyte membrane. The proton conductivity is also higher at the higher water content of the electrolyte membrane or in the wet state of the electrolyte membrane, while being lower at the lower water content of the electrolyte membrane or in the dried state of the electrolyte membrane.

Figure 4:
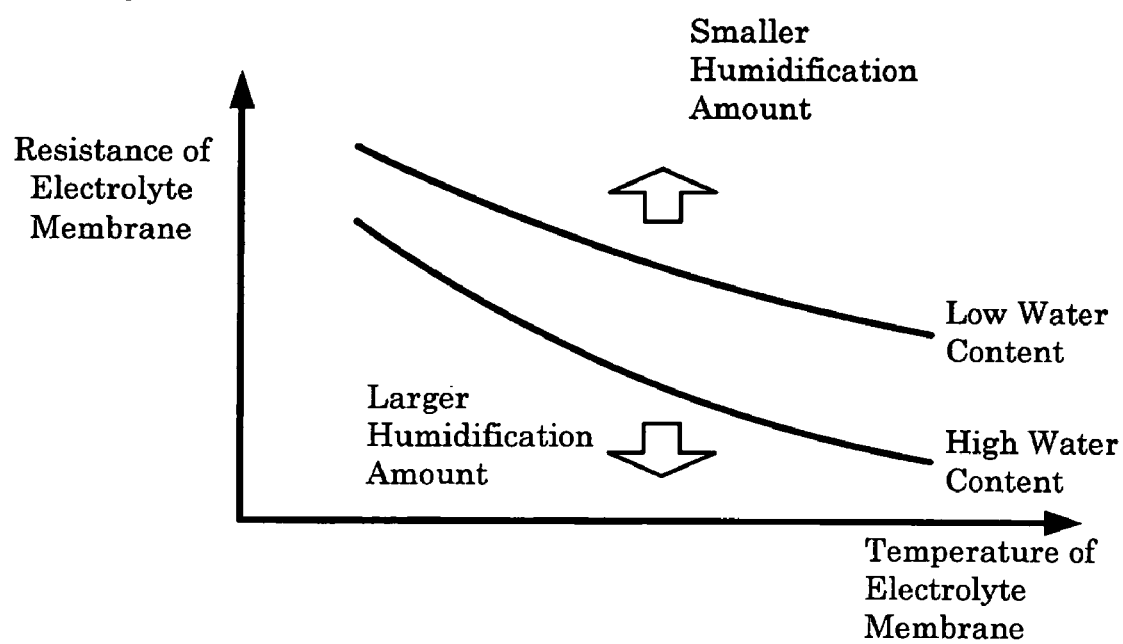
FIG. 4 shows variations in resistance of an electrolyte membrane against temperature and water content of the electrolyte membrane in the fuel cells.

FIG. 4 shows variations in resistance of the electrolyte membrane against the temperature and the water content of the electrolyte membrane in the fuel cells. As shown in FIG. 4, the electrolyte membrane has the higher resistance at the lower temperature and the lower water content (in the dry state), while having the lower resistance at the higher temperature and the higher water content (in the wet state). The resistance of the electrolyte membrane decreases with a temperature increase, since the proton conduction is an ionic conduction caused by a chemical reaction. This is distinctly different from the phenomenon of decreasing the resistance of metal or carbon with a temperature decrease due to the electrical conduction, such as hole migration or electron migration.

The water content of the electrolyte membrane (that is, the moisture condition of the electrolyte) varies with a variation in humidification amount of the reactive gas (hydrogen or the air) supplied to the fuel cells 100. As shown in FIG. 4, the smaller humidification amount leads to the lower water content (the dry state), and the larger humidification amount leads to the higher water content (the wet state). In the performance degradation detection of the embodiment, the FC temperature or the cooling water temperature of the fuel cells 100 is used as the temperature of the electrolyte membrane.

In the fuel cells 100, the resistance of the electrolyte membrane is thus estimated from the humidification amount of the supplied gas and the FC temperature as the operating conditions.

The separator is generally made of a metal material or a carbon material and has a known resistance.

The procedure of the embodiment estimates the resistance of the electrolyte membrane with regard to each combination of the humidification amount and the FC temperature in the normal state of the fuel cells 100 (with no performance degradation). Multiple typical combinations of the humidification amount and the FC temperature are provided, and the resistance of the electrolyte membrane is estimated corresponding to each of the multiple typical combinations. Addition of the resistance of the separators to the respective estimated resistances of the electrolyte membrane gives values of the ohmic resistance. Further addition of a predetermined margin to the respective values of ohmic resistance determines degradation reference values with regard to the respective combinations of the humidification amount and the FC temperature. The multiple determined degradation reference values with the humidification amount and the FC temperature as keys are stored as a two-dimensional degradation detection criteria table 422 in the memory 420.

Each degradation reference value is set to be higher at the smaller humidification amount (that is, in the dry state of the electrolyte membrane) and the lower FC temperature (that is, the lower temperature of the electrolyte membrane) and to be lower at the larger humidification amount (that is, in the wet state of the electrolyte membrane) and the higher FC temperature (that is, the higher temperature of the electrolyte membrane).

Figure 5:
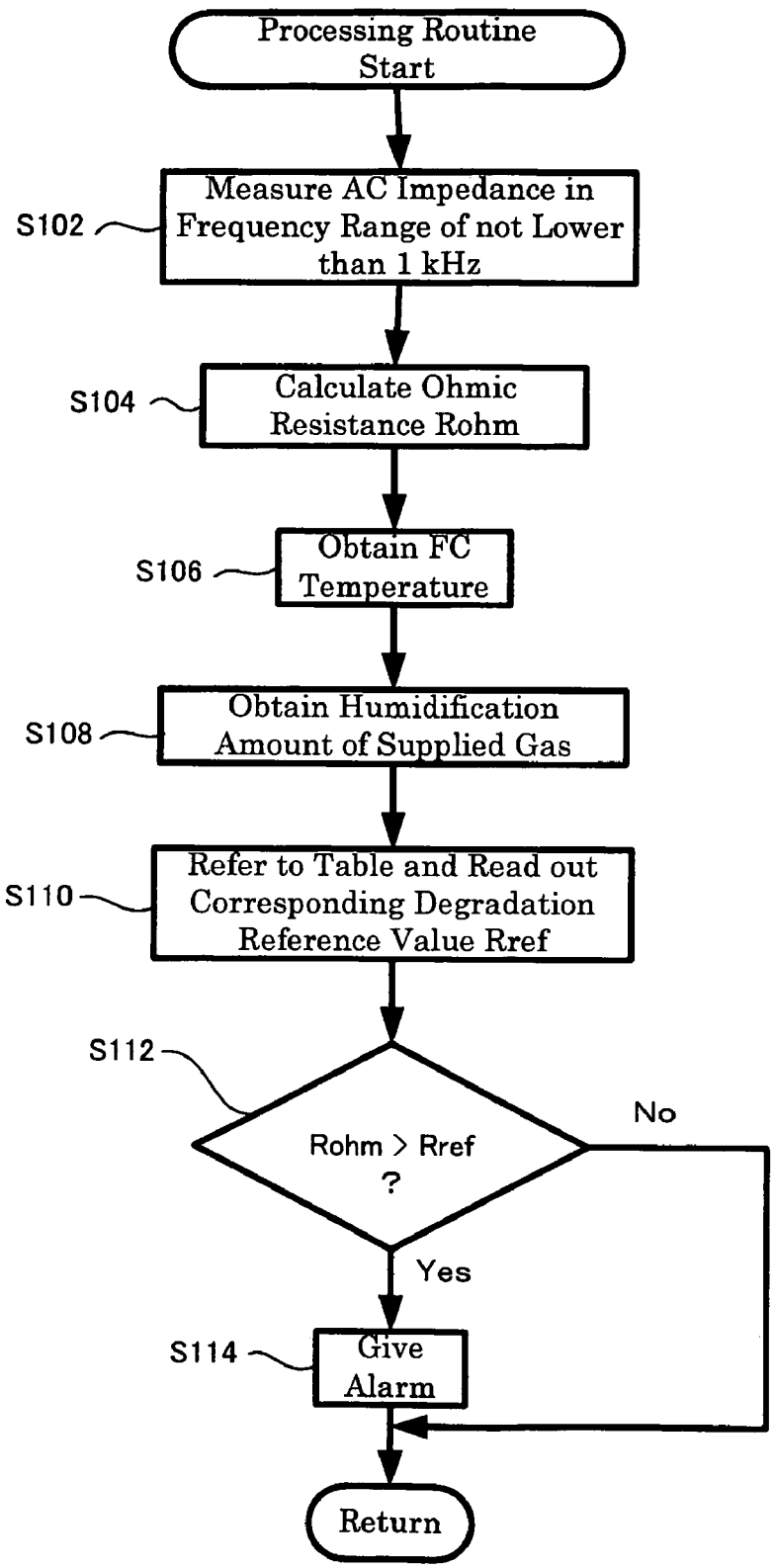
FIG. 5 is a flowchart showing a processing routine of performance degradation detection based on an ohmic resistance.

FIG. 5 is a flowchart showing a processing routine of performance degradation detection based on the ohmic resistance. In this embodiment, on the start of power generation by the fuel cells 100, the processing routine of FIG. 5 is performed at regular intervals or at irregular intervals. On the start of the processing routine shown in FIG. 5, the AC impedance meter 200 under control of the detection unit 400 measures the AC impedance of the fuel cells 100 in a frequency range of not lower than 1 kHz (step S102) and outputs the measurement result to the detection unit 400. According to a concrete procedure, the impedance measurement module 220 applies an alternating current signal between the cathode and the anode of the fuel cells 100. While the frequency sweep module 210 sweeps the frequency ω in a range of not lower than 1 kHz, the impedance measurement module 220 measures the electric current and the voltage of the fuel cells 100 to determine the AC impedance of the fuel cells 100 at each frequency.

The detection unit 400 calculates the ohmic resistance Rohm from the measurement result output from the AC impedance meter 200, that is, the determined AC impedance (step S104).

Figure 6:
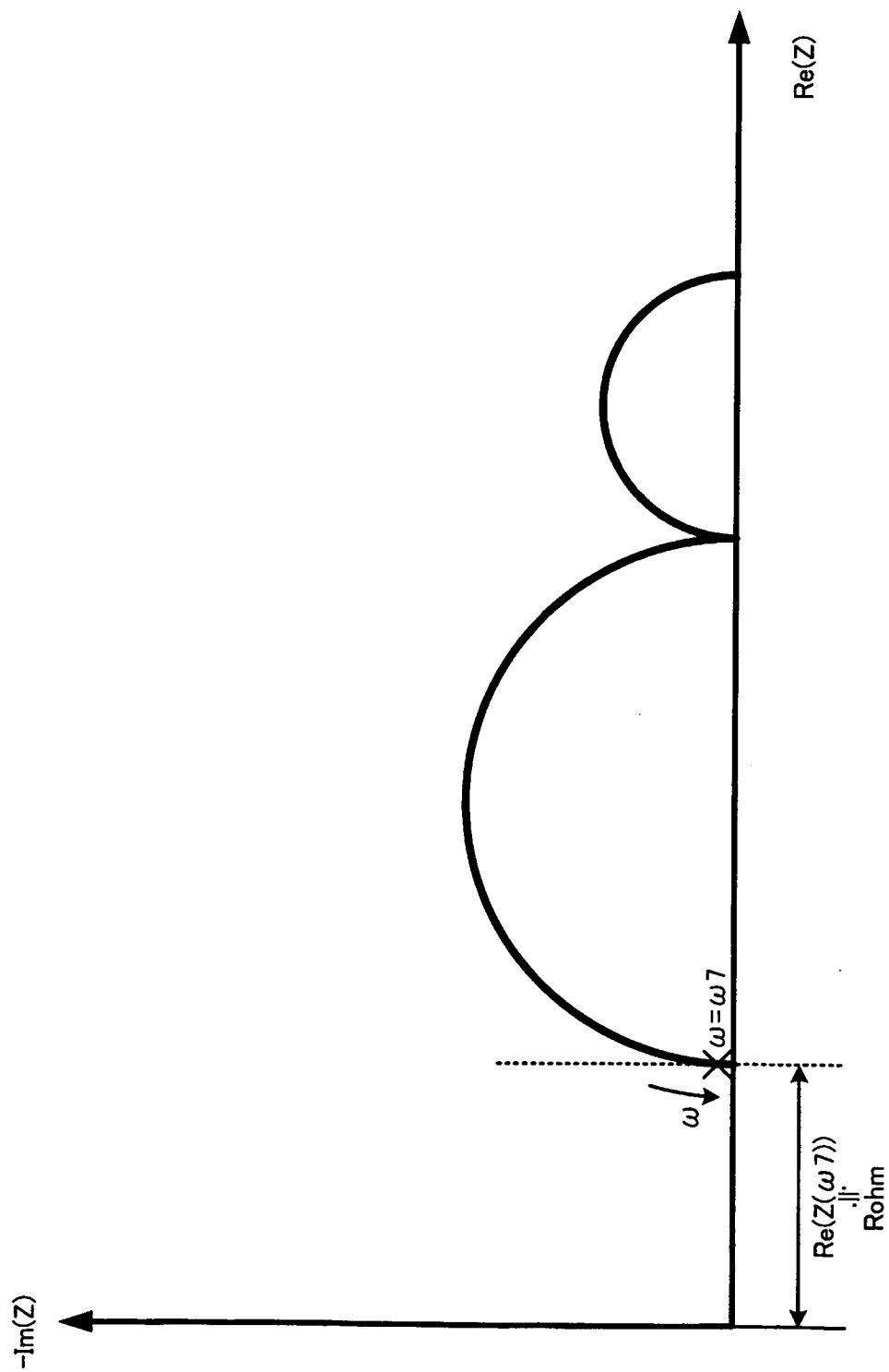
FIG. 6 shows a measurement value of the AC impedance and a calculated value of the ohmic resistance.

FIG. 6 shows a measurement value of the AC impedance and a calculated value of the ohmic resistance. As explained previously, the value of the ohmic resistance Rohm is equal to the distance of the real part Re(Z) of the AC impedance Z from the origin of the complex plane to one end (ω=∞) of the large semicircular arc. Strictly speaking, the value (∞) of the AC impedance Z at the infinite frequency (ω=∞) is to be used for calculation of the ohmic resistance Rohm. The procedure of the embodiment, however, measures the AC impedance in the high frequency range of the kHz order and uses the measurement value of the AC impedance for calculation of the ohmic resistance Rohm. This is because the strict definition of the frequency is not essential but the 'high frequency of not lower than 1 kHz' is sufficient for determination of the ohmic resistance Rohm.

In the illustrated example of FIG. 6, a measurement value Z (ω7) of the AC impedance at a frequency of ω=ω7 is obtained in the frequency range of not lower than 1 kHz, and the ohmic resistance Rohm is determined by the real part Re(Z(ω7)) of the measured AC impedance Z(ω7).

During such impedance measurement, the FC temperature sensor 320 measures the FC temperature (step S106), while the humidification amount sensor 350 measures the humidification amount of the supplied gas (step S108). The detection unit 400 obtains these measurement results. The measured FC temperature is used for the temperature of the electrolyte membrane, and the measured humidification amount is used as a parameter indirectly representing the moisture state of the electrolyte membrane.

The detection unit 400 subsequently refers to the degradation detection criteria table 422 stored in the memory 420 and reads a degradation reference value Rref corresponding to the combination of the obtained FC temperature and the obtained humidification amount among the multiple degradation reference values stored in the table (step S110). The detection unit 400 then compares the calculated ohmic resistance Rohm with the degradation reference value Rref read from the degradation detection criteria table 422 and determines whether the ohmic resistance Rohm exceeds the degradation reference value Rref (step S112). When the ohmic resistance Rohm exceeds the degradation reference value Rref, there may be degradation of the electrolyte membrane (that is, lowered proton conductivity) or an increased contact resistance of the separator (that is, degradation of the separator). The detection unit 400 then controls the alarm unit 500 to give an alarm to the driver (step S114). When the ohmic resistance Rohm does not exceed the degradation reference value Rref, on the other hand, there may be no performance degradation. The processing routine of FIG. 5 is then returned without giving an alarm.

This series of processing detects performance degradation based on the ohmic resistance Rohm.

E. Performance Degradation Detection Based on Reaction Resistance

The reaction resistance is dominated by the catalytic activity of the chemical reaction in the fuel cells 100. The catalytic activity is higher at the higher temperature and lower at the lower temperature, while being higher at the higher pressure of the supplied gas (air) and lower at the lower pressure of the supplied gas (air). The catalytic activity is also higher at the smaller power generation current of the fuel cells 100 and lower at the greater power generation current.

Figure 7:
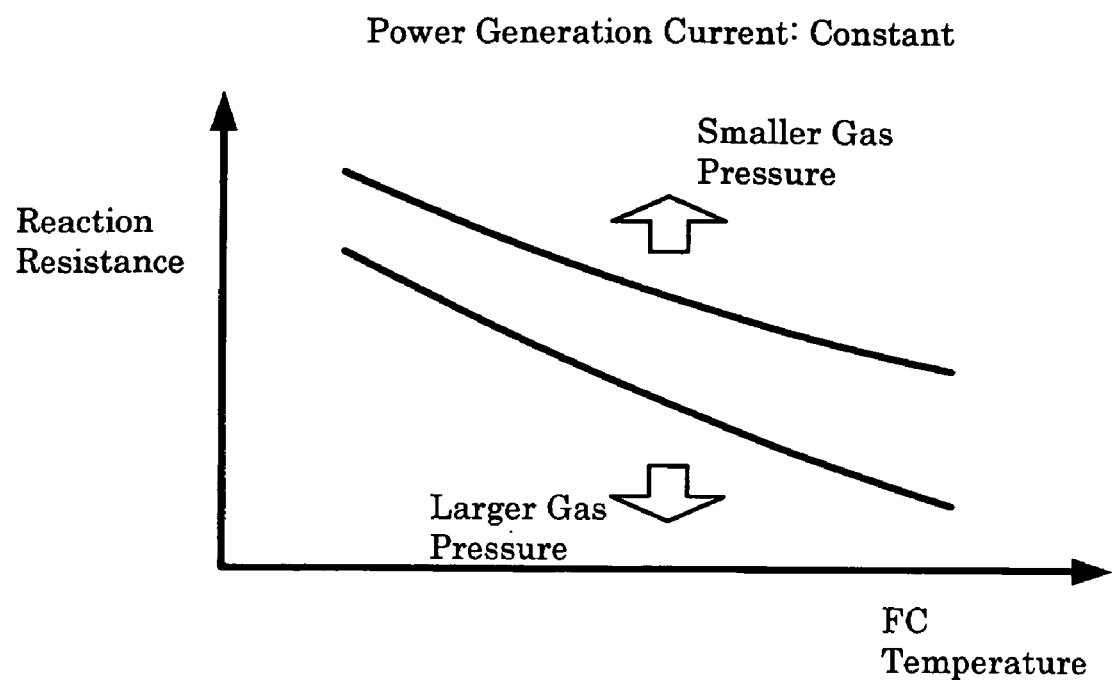
FIG. 7 shows variations in reaction resistance against FC temperature and pressure in the fuel cells.

FIG. 7 shows variations in reaction resistance against the FC temperature and the pressure in the fuel cells. As shown in the graph of FIG. 7, under the condition of a constant power generation current (fixed current value) of the fuel cells 100, the reaction resistance is higher at the lower FC temperature and the lower pressure and is lower at the higher FC temperature and the higher pressure. Under the condition of a fixed FC temperature and a fixed pressure, the reaction resistance is higher at the greater power generation current and is lower at the smaller power generation current.

In the fuel cells 100, the reaction resistance is thus estimated from the FC temperature, the pressure of the supplied gas, and the power generation current as the operating conditions.

The procedure of the embodiment estimates the reaction resistance with regard to each combination of the FC temperature, the pressure, and the power generation current in the normal state of the fuel cells 100 (with no performance degradation). Multiple typical combinations of the FC temperature, the pressure, and the power generation current are provided, and the reaction resistance is estimated corresponding to each of the multiple typical combinations. Addition of a predetermined margin to the respective values of reaction resistance determines degradation reference values with regard to the respective combinations of the FC temperature, the pressure, and the power generation current. The multiple determined degradation reference values with the FC temperature, the pressure, and the power generation current as keys are stored as a three-dimensional degradation detection criteria table 422 in the memory 420.

Each degradation reference value is set to be higher at the lower FC temperature, the lower pressure, and the greater power generation current and to be lower at the higher FC temperature, the higher pressure, and the smaller power generation current. Namely the degradation reference value is set to be higher at the lower catalytic activity and to be lower at the higher catalytic activity.

Figure 8:
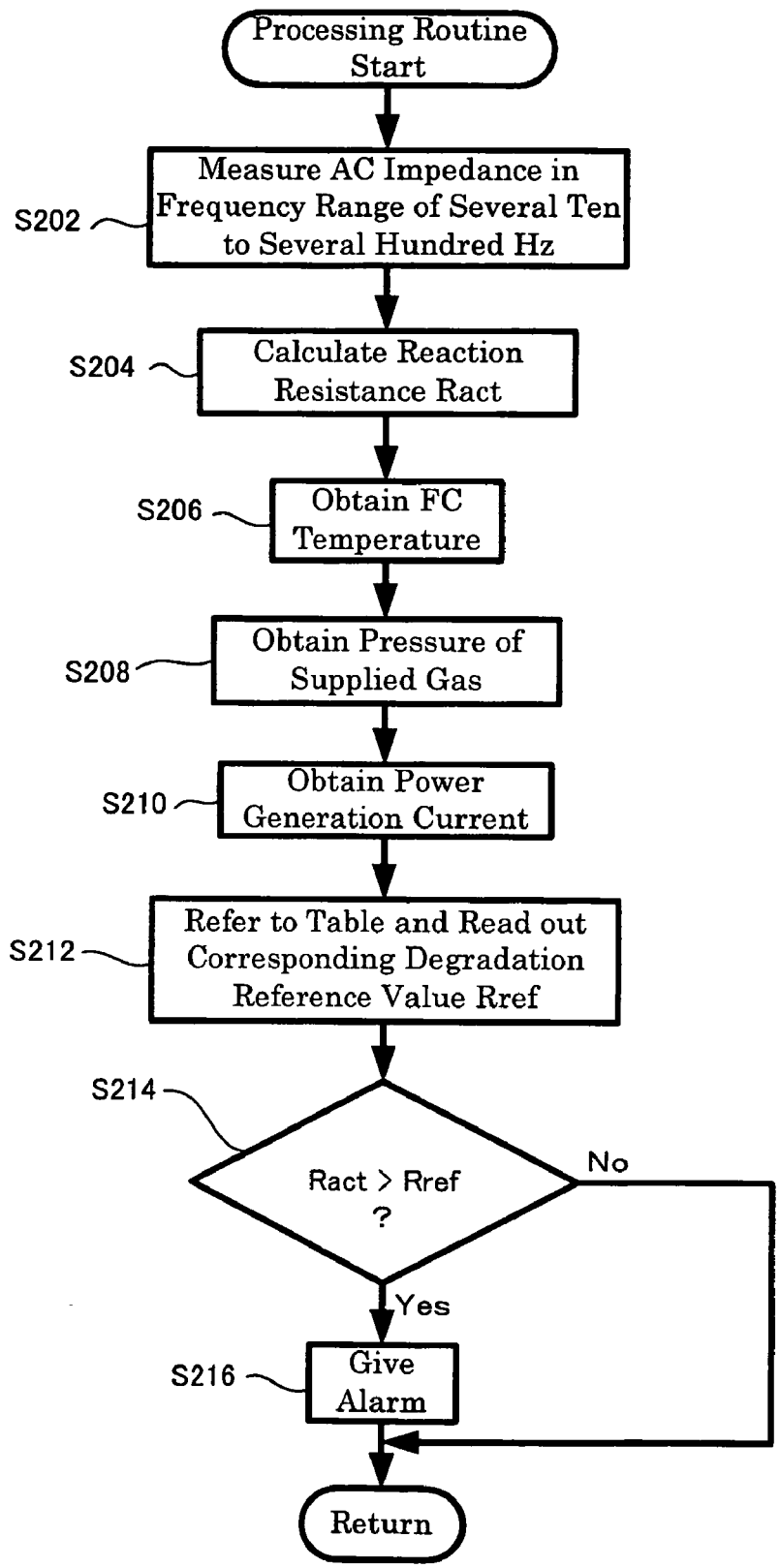
FIG. 8 is a flowchart showing a processing routine of performance degradation detection based on the reaction resistance.

FIG. 8 is a flowchart showing a processing routine of performance degradation detection based on the reaction resistance. In this embodiment, like the processing routine of FIG. 5, on the start of power generation by the fuel cells 100, the processing routine of FIG. 8 is performed at regular intervals or at irregular intervals. On the start of the processing routine shown in FIG. 8, the AC impedance meter 200 under control of the detection unit 400 measures the AC impedance of the fuel cells 100 in a frequency range of several ten Hz to several hundred Hz (step S202) and outputs the measurement result to the detection unit 400. The detection unit 400 calculates the reaction resistance Ract from the measurement result output from the AC impedance meter 200, that is, the determined AC impedance (step S204).

Figure 9:
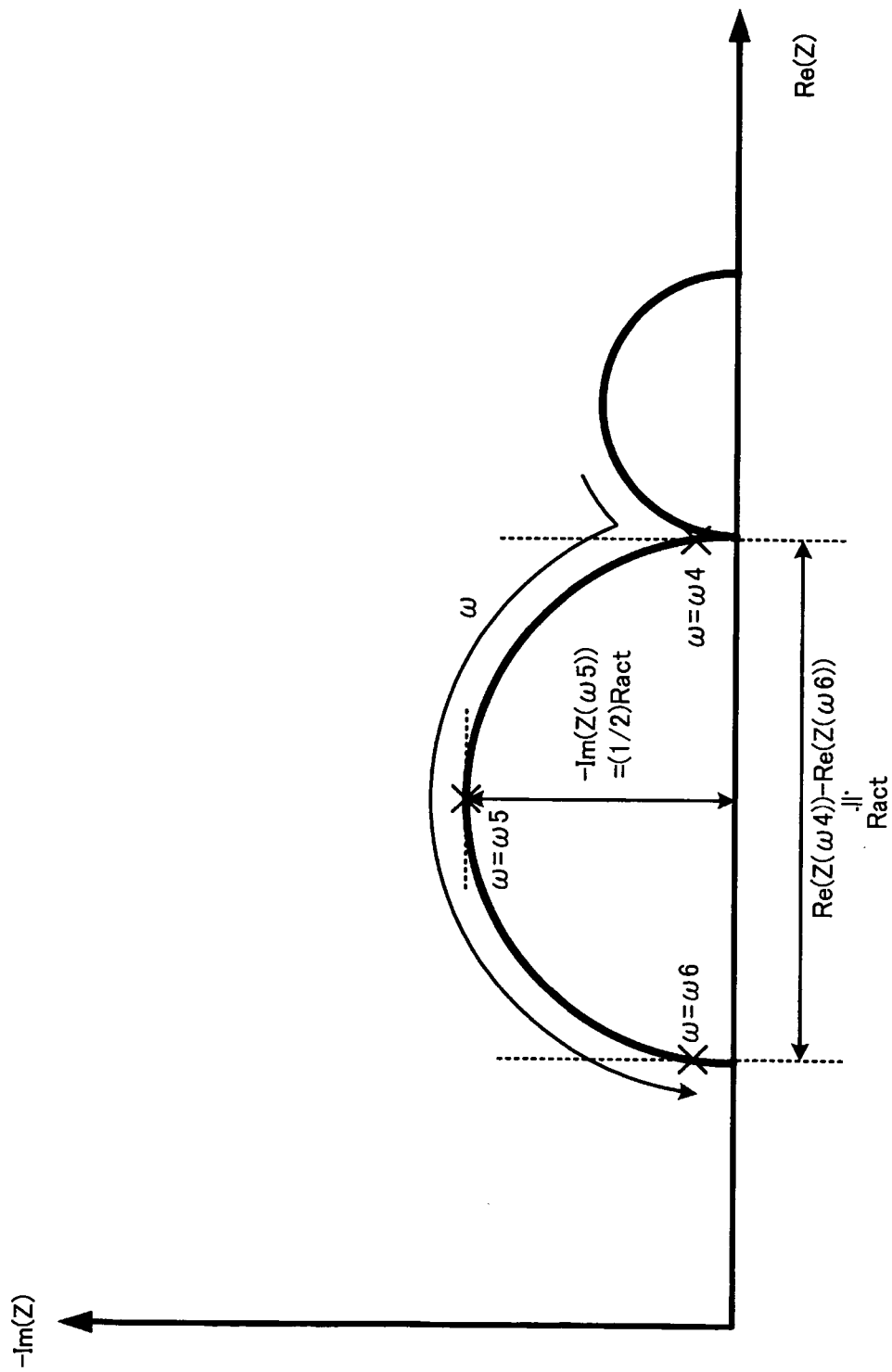
FIG. 9 shows a measurement value of the AC impedance and a calculated value of the reaction resistance.

FIG. 9 shows a measurement value of the AC impedance and a calculated value of the reaction resistance. As explained previously, the value of the reaction resistance Ract is equal to the distance of the real part Re(Z) of the AC impedance Z from one end ($\omega=\infty$) to the other end of the large semicircular arc. The reaction resistance Ract may be calculated by one of the following two methods:

1) A first method selects a frequency (for example, $\omega=\omega5$) having a local maximum of the imaginary part of the AC impedance (that is, a vertex of the large semicircular arc) as a specific frequency in the frequency range of several ten Hz to several hundred Hz and obtains a measurement value $Z(\omega5)$ of the AC impedance at the selected frequency. The first method then extracts an imaginary part $-Im(Z(\omega5))$ from the measurement value $Z(\omega5)$ and doubles the imaginary part $-Im(Z(\omega5))$ to determine the reaction resistance Ract. This is because the local maximum of the imaginary part of the AC impedance (the vertex of the large semicircular arc) corresponds to ½ of the reaction resistance ($-Im(Z(\omega5))=½Ract$) as shown in FIG. 9.

2) A second method selects two frequencies (for example, $\omega=\omega4$, $\omega6$) having relatively small values of the imaginary part of the AC impedance as specific frequencies in the frequency range of several ten Hz to several hundred Hz and obtains measurement values $Z(\omega4)$ and $Z(\omega6)$ of the AC impedance at the selected frequencies. The second method then extracts respective real parts $Re(Z(\omega4))$ and $Re(Z(\omega6))$ from the measurement values $Z(\omega4)$ and $Z(\omega6)$ and calculates their difference $Re(Z(\omega4))-Re(Z(\omega6))$ to determine the reaction resistance Ract.

During such impedance measurement, the FC temperature sensor 320 measures the FC temperature (step S206), while the gas pressure sensor 340 measures the pressure of the supplied gas (air) (step S208) and the current sensor 310 measures the power generation current (step S210). The detection unit 400 obtains these measurement results. The measured FC temperature, pressure, and power generation current are used as parameters representing the catalytic activity as mentioned previously.

The detection unit 400 subsequently refers to the degradation detection criteria table 422 stored in the memory 420 and reads a degradation reference value Rref corresponding to the combination of the obtained FC temperature, the obtained pressure, and the obtained power generation current among the multiple degradation reference values stored in the table (step S212). The detection unit 400 then compares the calculated reaction resistance Ract with the degradation reference value Rref read from the degradation detection criteria table 422 and determines whether the reaction resistance Ract exceeds the degradation reference value Rref (step S214).

Figure 10:
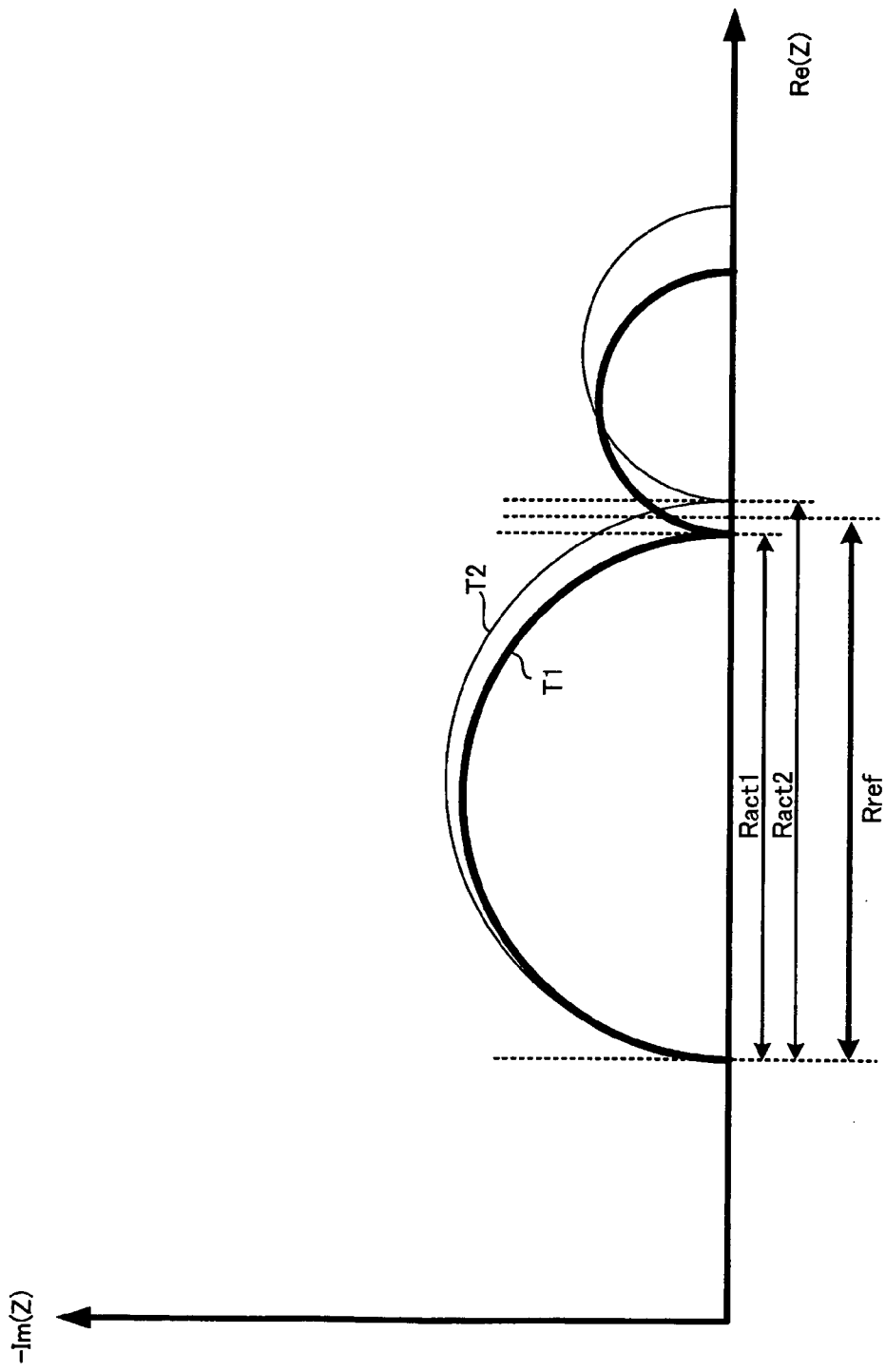
FIG. 10 shows a locus of AC impedance in the normal state and a locus of AC impedance in the state of performance degradation related to the reaction resistance.

FIG. 10 shows a locus of AC impedance in the normal state and a locus of AC impedance in the state of performance degradation related to the reaction resistance. In the graph of FIG. 10, T1 represents the locus of the AC impedance in the normal state, and T2 represents the locus of the AC impedance in the state of performance degradation related to the reaction resistance. Ract1, Ract2, and Rref respectively denote a value of reaction resistance in the normal state, a value of reaction resistance in the state of performance degradation, and the degradation reference value.

When the reaction resistance Ract exceeds the degradation reference value Rref (Ract2>Rref), there may be degradation of the catalytic activity. The detection unit 400 then controls the alarm unit 500 to give an alarm to the driver (step S216). When the reaction resistance Ract does not exceed the degradation reference value Rref (Ract1<Rref), on the other hand, there may be no performance degradation. The processing routine of FIG. 8 is then returned without giving an alarm.

This series of processing detects performance degradation based on the reaction resistance Ract.

F. Performance Degradation Detection Based on Diffusion Resistance

The diffusion resistance represents the difficulty in diffusion of the gas supplied to the fuel cells 100 or more specifically the difficulty in reach of oxygen $O_2$ included in the air to the catalyst. As shown in the graph of FIG. 11, under the condition of a constant power generation current (fixed current value) of the fuel cells 100, the diffusion resistance is lower at the higher flow rate of the supplied air and higher at the lower flow rate of the supplied air, while being lower at the smaller humidification amount of the supplied air and higher at the larger humidification amount of the supplied air.

Figure 11:
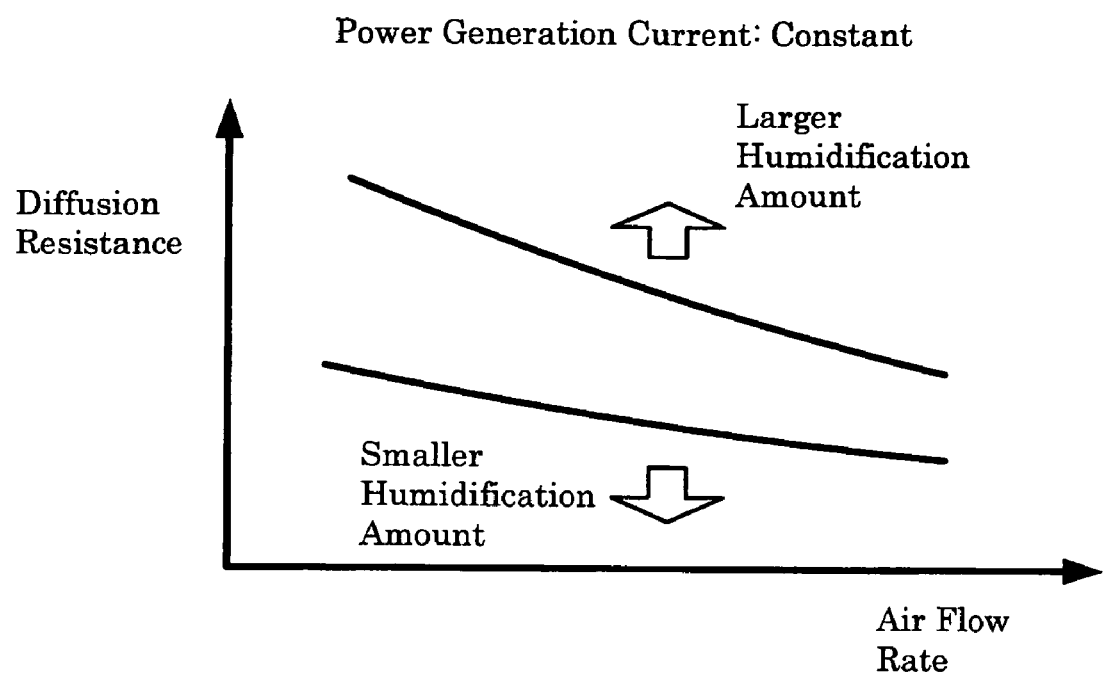
FIG. 11 shows variations in diffusion resistance against air flow rate and humidification amount in the fuel cells.

FIG. 11 shows variations in diffusion resistance against the air flow rate and the humidification amount in the fuel cells.

In the fuel cells 100, the diffusion resistance is thus estimated from the air flow rate, the humidification amount, and the power generation current as the operating conditions.

The procedure of the embodiment estimates the diffusion resistance with regard to each combination of the air flow rate, the humidification amount, and the power generation current in the normal state of the fuel cells 100 (with no performance degradation). Multiple typical combinations of the air flow rate, the humidification amount, and the power generation current are provided, and the diffusion resistance is estimated corresponding to each of the multiple typical combinations. Addition of a predetermined margin to the respective values of diffusion resistance determines degradation reference values with regard to the respective combinations of the air flow rate, the humidification amount, and the power generation current. The multiple determined degradation reference values with the air flow rate, the humidification amount, and the power generation current as keys are stored as a three-dimensional degradation detection criteria table 422 in the memory 420.

Each degradation reference value is set to be higher at the lower air flow rate and the larger humidification amount and to be lower at the higher air flow rate and the smaller humidification amount. Namely the degradation reference value is set to be higher in the poorer diffusion state of the gas supplied to the fuel cells 100 (specifically oxygen $O_2$ included in the air) and to be lower in the better diffusion state of the supplied gas.

Figure 12:
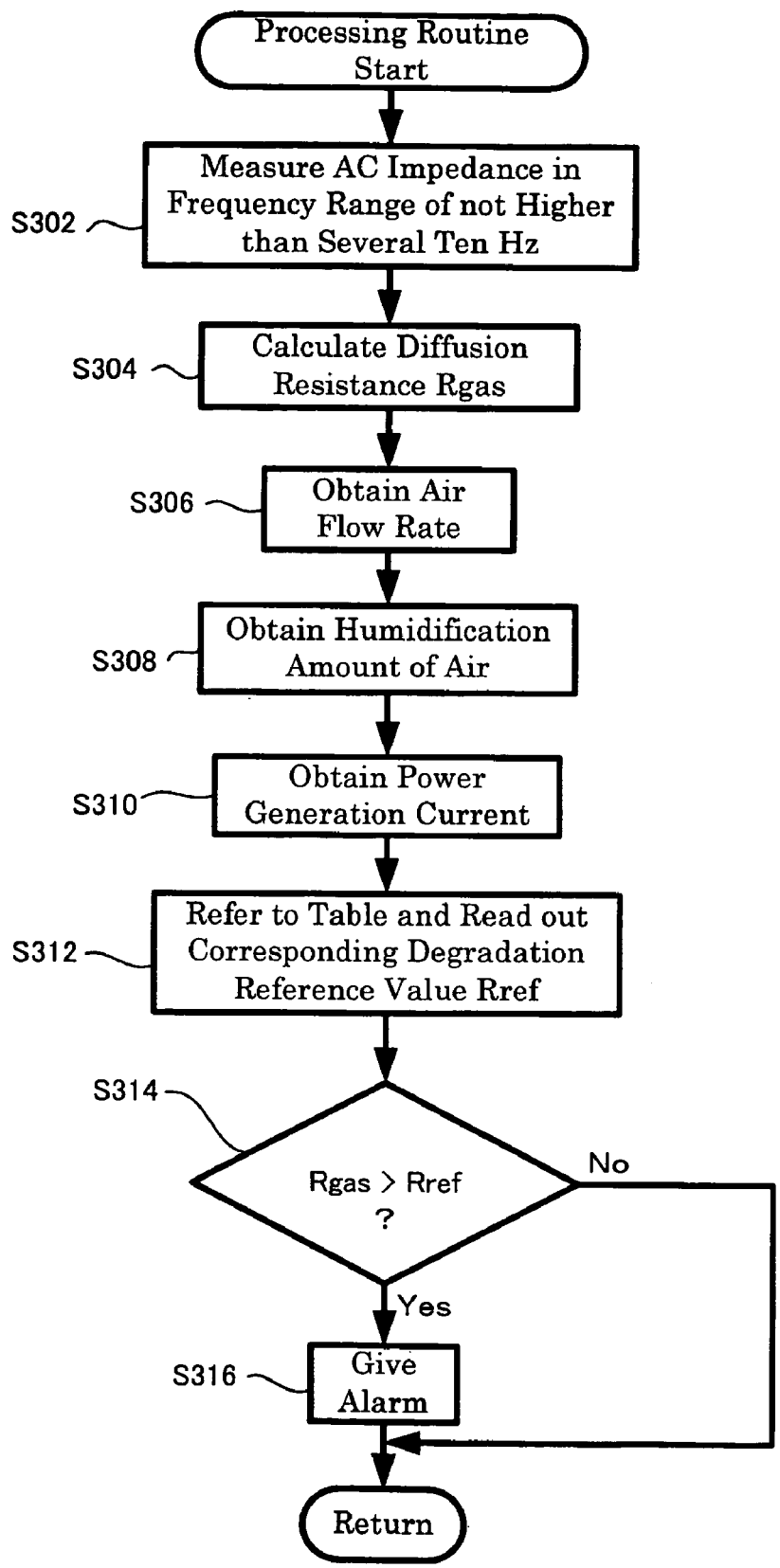
FIG. 12 is a flowchart showing a processing routine of performance degradation detection based on the diffusion resistance.

FIG. 12 is a flowchart showing a processing routine of performance degradation detection based on the diffusion resistance. In this embodiment, like the processing routines of FIGS. 5 and 8, on the start of power generation by the fuel cells 100, the processing routine of FIG. 12 is performed at regular intervals or at irregular intervals. On the start of the processing routine shown in FIG. 12, the AC impedance meter 200 under control of the detection unit 400 measures the AC impedance of the fuel cells 100 in a frequency range of not higher than several ten Hz (step S302) and outputs the measurement result to the detection unit 400. The detection unit 400 calculates the diffusion resistance Rgas from the measurement result output from the AC impedance meter 200, that is, the determined AC impedance (step S304).

Figure 13:
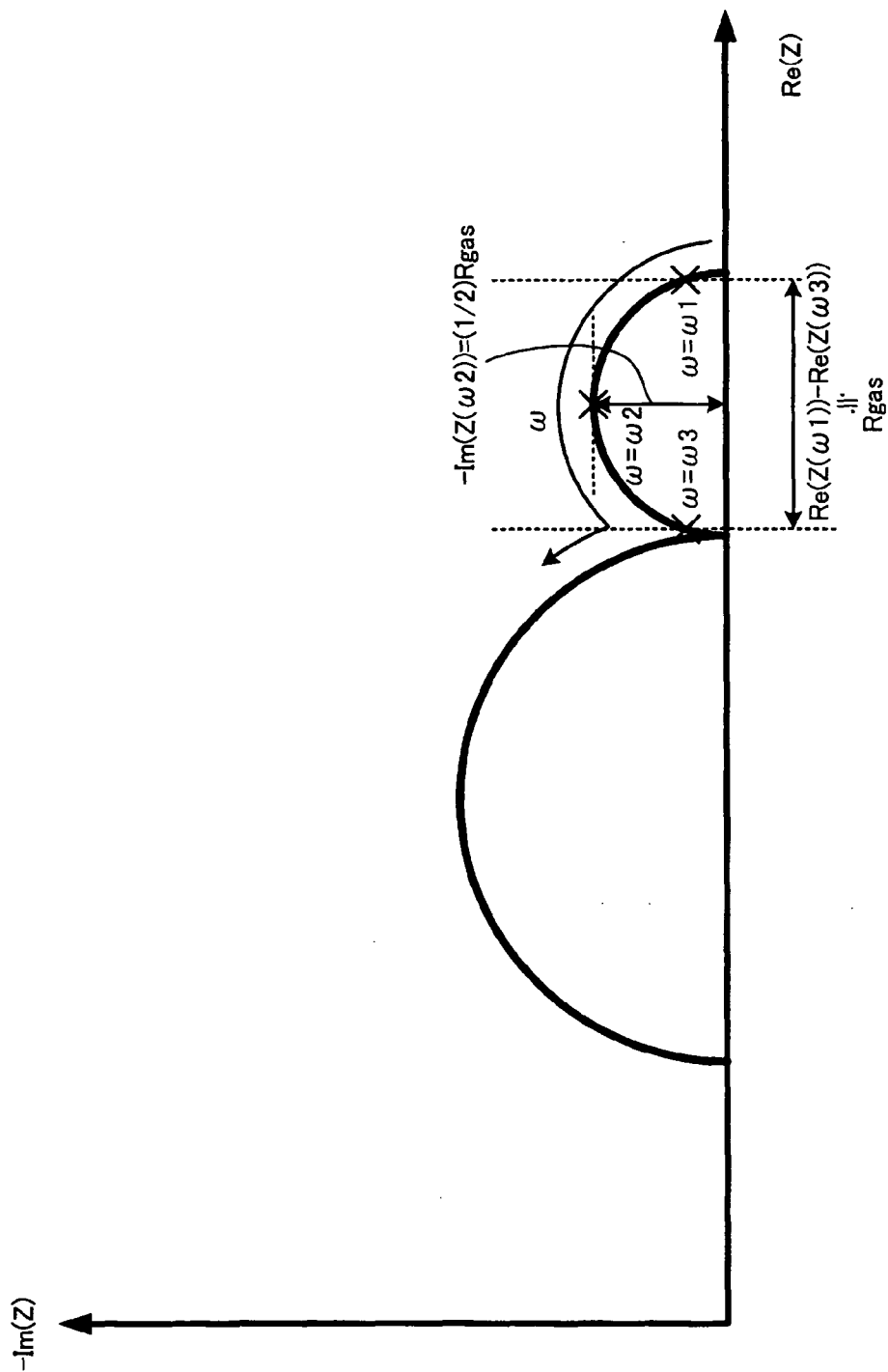
FIG. 13 shows a measurement value of the AC impedance and a calculated value of the diffusion resistance.

FIG. 13 shows a measurement value of the AC impedance and a calculated value of the diffusion resistance. As explained previously, the value of the diffusion resistance Rgas is equal to the distance of the real part Re(Z) of the AC impedance Z from one end to the other end ($\omega$=0) of the small semicircular arc. In the same manner as the reaction resistance Ract, the diffusion resistance Rgas may be calculated by one of the following two methods:

1) A first method selects a frequency (for example, $\omega$=$\omega$2) having a local maximum of the imaginary part of the AC impedance (that is, a vertex of the small semicircular arc) as a specific frequency in the frequency range of not higher than several ten Hz and obtains a measurement value Z($\omega$2) of the AC impedance at the selected frequency. The first method then extracts an imaginary part $-$Im(Z($\omega$2)) from the measurement value Z($\omega$2) and doubles the imaginary part $-$Im(Z($\omega$2)) to determine the diffusion resistance Rgas. This is because the local maximum of the imaginary part of the AC impedance (the vertex of the small semicircular arc) corresponds to ½ of the diffusion resistance ($-$Im(Z($\omega$2))=½Rgas) as shown in FIG. 13.

2) A second method selects two frequencies (for example, $\omega$=$\omega$1, $\omega$3) having relatively small values of the imaginary part of the AC impedance as specific frequencies in the frequency range of not higher than several ten Hz and obtains measurement values Z($\omega$1) and Z($\omega$3) of the AC impedance at the selected frequencies. The second method then extracts respective real parts Re(Z($\omega$1)) and Re(Z($\omega$3)) from the measurement values Z($\omega$1) and Z($\omega$3) and calculates their difference Re(Z($\omega$1))$-$Re(Z($\omega$3)) to determine the diffusion resistance Rgas.

During such impedance measurement, the air flow meter 330 measures the flow rate of the supplied air (step S306), while the humidification amount sensor 350 measures the humidification amount of the supplied air (step S308) and the current sensor 310 measures the power generation current (step S310). The detection unit 400 obtains these measurement results. The measured air flow rate, humidification amount, and power generation current are used as parameters representing the diffusion state of the gas (that is, oxygen included in the supplied air) as mentioned previously.

The detection unit 400 subsequently refers to the degradation detection criteria table 422 stored in the memory 420 and reads a degradation reference value Rref corresponding to the combination of the obtained air flow rate, the obtained humidification amount, and the obtained power generation current among the multiple degradation reference values stored in the table (step S312). The detection unit 400 then compares the calculated diffusion resistance Rgas with the degradation reference value Rref read from the degradation detection criteria table 422 and determines whether the diffusion resistance Rgas exceeds the degradation reference value Rref (step S314).

When the diffusion resistance Rgas exceeds the degradation reference value Rref, the diffusion layer may suffer from poor water repellency or clogging and have degradation. The detection unit 400 then controls the alarm unit 500 to give an alarm to the driver (step S316). When the diffusion resistance Rgas does not exceed the degradation reference value Rref, on the other hand, there may be no performance degradation. The processing routine of FIG. 12 is then returned without giving an alarm.

This series of processing detects performance degradation based on the diffusion resistance Rgas. The occurrence of flooding due to a variation in operating conditions of the fuel cells 100 is regarded as a temporary performance decrease.

G. Advantages of Embodiment

As described above, the procedure of the embodiment enables easy detection of performance degradation occurring in the fuel cells, irrespective of a variation in operating conditions of the fuel cells, for example, the FC temperature, the humidification amount, the pressure, the power generation current, and the air flow rate. This arrangement distinctly discriminate a performance degradation from a simple temporary performance decrease caused by a variation in operating conditions of the fuel cells, thus ensuring early detection of performance degradation in the fuel cells.

H. Other Aspects

The embodiment discussed above is to be considered in all aspects as illustrative and not restrictive. There may be many modifications, changes, and alterations without departing from the scope or spirit of the main characteristics of the present invention.

H-1. MODIFIED EXAMPLE 1

The procedure of the embodiment detects performance degradation based on each of the ohmic resistance Rohm, the reaction resistance Ract, and the diffusion resistance Rgas constituting the internal resistance Rin of the fuel cells 100. One possible modification may detect performance degradation based on the internal resistance Rin as the sum of the ohmic resistance Rohm, the reaction resistance Ract, and the diffusion resistance Rgas.

A degradation reference value is determined in advance for each combination of the FC temperature, the humidification amount, the pressure, the power generation current, and the air flow rate. Multiple determined degradation reference values with these five parameters as keys are stored as a five-dimensional degradation detection criteria table 422 in the memory 420. The performance degradation detection is then performed according to a routine of performance degradation detection shown in FIG. 14.

Figure 14:
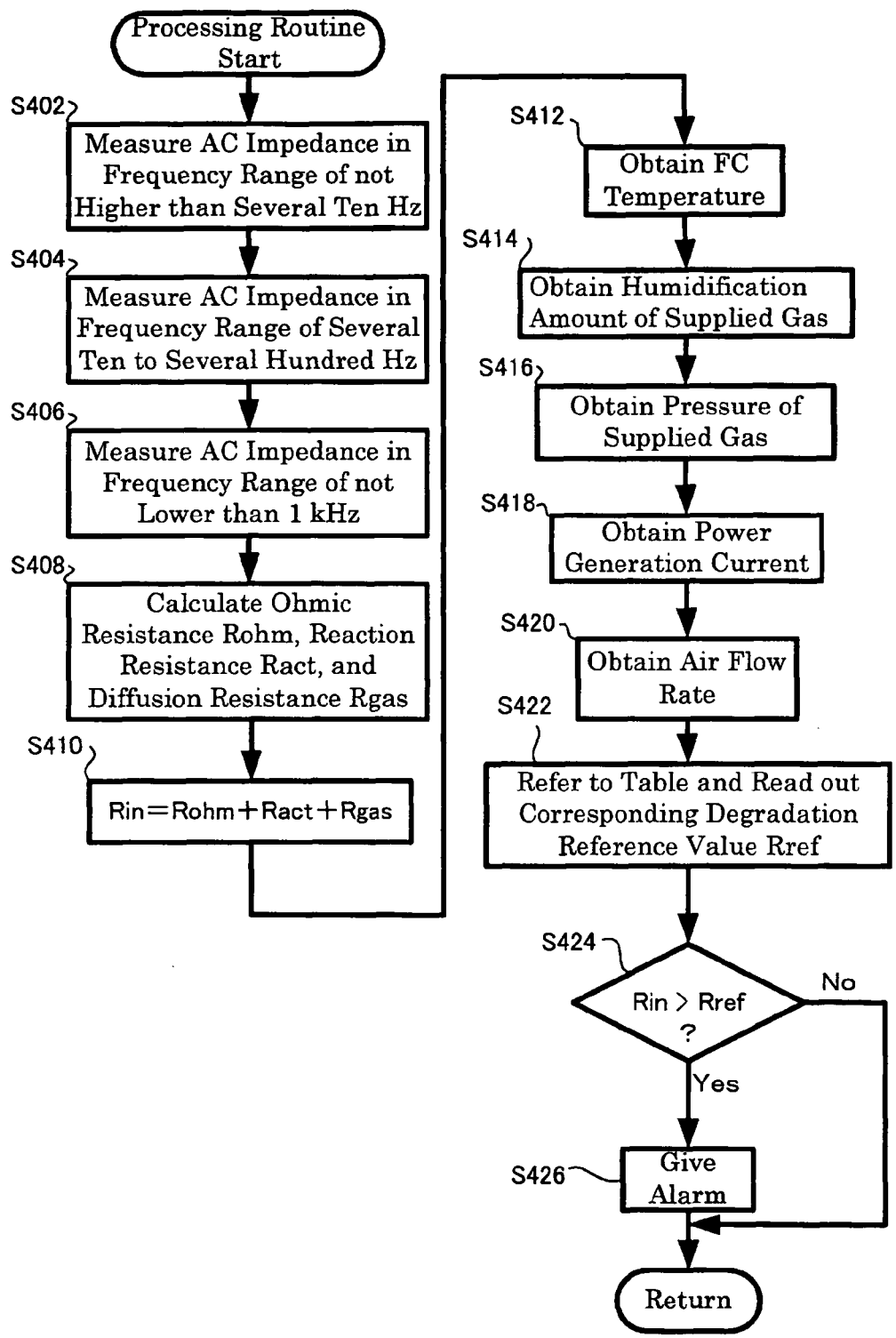
FIG. 14 is a flowchart showing a processing routine of performance degradation detection based on an internal resistance.

FIG. 14 is a flowchart showing the routine of performance degradation detection based on the internal resistance. In this modified example, on the start of power generation by the fuel cells 100, the processing routine of FIG. 14 is performed at regular intervals or at irregular intervals. On the start of the processing routine shown in FIG. 14, the AC impedance meter 200 under control of the detection unit 400 successively measures the AC impedance of the fuel cells 100 in the frequency range of not higher than several ten Hz (step S402), measures the AC impedance of the fuel cells 100 in the frequency range of several ten Hz to several hundred Hz (step S404), and measures the AC impedance of the fuel cells 100 in the frequency range of not lower than 1 kHz (step S406). The AC impedance meter 200 outputs these measurement results to the detection unit 400.

The detection unit 400 calculates the ohmic resistance Rohm, the reaction resistance Ract, and the diffusion resistance Rgas from the measurement results output from the AC impedance meter 200, that is, the determined AC impedances (step S408) and specifies the internal resistance Rin as the sum of these resistances (step S410).

During such impedance measurement, the FC temperature sensor 320 measures the FC temperature (step S412), while the humidification amount sensor 350 measures the humidification amount of the supplied air (step S414), the gas pressure sensor 340 measures the pressure of the supplied gas (step S416), the current sensor 310 measures the power generation current (step S418), and the air flow meter 330 measures the flow rate of the supplied air (step S420). The detection unit 400 obtains these measurement results.

The detection unit 400 subsequently refers to the degradation detection criteria table 422 stored in the memory 420 and reads a degradation reference value Rref corresponding to the combination of the obtained FC temperature, the obtained humidification amount, the obtained pressure of the supplied gas, the obtained power generation current, and the obtained air flow rate among the multiple degradation reference values stored in the table (step S422). The detection unit 400 then compares the calculated internal resistance Rin with the degradation reference value Rref read from the degradation detection criteria table 422 and determines whether the internal resistance Rin exceeds the degradation reference value Rref (step S424). When the internal resistance Rin exceeds the degradation reference value Rref, there may be some performance degradation in the fuel cells 100. The detection unit 400 then controls the alarm unit 500 to give an alarm to the driver (step S426). When the internal resistance Rin does not exceed the degradation reference value Rref, on the other hand, there may be no performance degradation. The processing routine of FIG. 14 is then returned without giving an alarm.

This series of processing detects performance degradation based on the internal resistance Rin.

H-2. MODIFIED EXAMPLE 2

In the embodiment described above, the performance degradation detection based on the ohmic resistance Rohm uses the FC temperature and the humidification amount as the two parameters representing the operating conditions of the fuel cells 100. The performance degradation detection based on the reaction resistance Ract uses the FC temperature, the pressure, and the power generation current as the three parameters representing the operating conditions of the fuel cells 100. The performance degradation detection based on the diffusion resistance Rgas uses the air flow rate, the humidification amount, and the power generation current as the three parameters representing the operating conditions of the fuel cells 100. In the modified example 1 described above, the performance degradation detection based on the internal resistance Rin uses the FC temperature, the humidification amount, the pressure, the power generation current, and the air flow rate as the five parameters representing the operating conditions of the fuel cells 100. Such specification of the parameters is, however, not restrictive. Each of the performance degradation detections may use at least one parameter representing the operating condition of the fuel cells 100 instead of the multiple parameters mentioned above or may use any additional parameters instead of or in addition of the above parameters. The FC temperature may be replaced by the temperature of the supplied gas.

H-3. MODIFIED EXAMPLE 3

In the embodiment described above, the fuel cells mounted on the vehicle are the target of performance degradation detection. This is, however, not restrictive but the technique of the invention is applicable to detect performance degradation in various other types of fuel cells, for example, stationary fuel cells or portable fuel cells.

The invention claimed is:

1. A performance degradation analyzer of detecting performance degradation in a fuel cell, the performance degradation analyzer comprising:
   an AC impedance meter configured to measure an AC impedance of the fuel cell against at least a specific frequency;
   an operating state sensor configured to detect a parameter value of an internal resistance of the fuel cell from the measured AC impedance of the fuel cell, wherein the detected parameter value of the internal resistance of the fuel cell is at least one of an ohmic resistance value, diffusion resistance value or reactant resistance value of the fuel cell and indicates an operating state of the fuel cell; and
   a detector configured to compare a corresponding reference value of the detected parameter value of the internal resistance of the fuel cell with the detected parameter value of the internal resistance value of the fuel cell obtained from the measured AC impedance of the fuel cell, the detector further configured to detect performance degradation in the fuel cell based on a result of the comparison.

2. The performance degradation analyzer in accordance with claim 1, wherein the specific frequency is a frequency suitable for measurement of the ohmic resistance in the fuel cell, the operating state sensor detects at least a parameter value related to a moisture state of an electrolyte membrane included in the fuel cell, as the parameter value indicating the operating state of the fuel cell, and the internal resistance value of the fuel cell obtained from the measured AC impedance is the ohmic resistance value of the fuel cell.

3. The performance degradation analyzer in accordance with claim 2, wherein the corresponding reference value is set to be higher in a drier state of the electrolyte membrane.

4. The performance degradation analyzer in accordance with claim 1, wherein the specific frequency is a frequency suitable for measurement of the ohmic resistance in the fuel cell, the operating state sensor detects at least one parameter value of an internal temperature of the fuel cell and a humidification amount of a gas supplied to the fuel cell, as the parameter indicating the operating state of the fuel cell, and the internal resistance value of the fuel cell obtained from the measured AC impedance is the ohmic resistance value of the fuel cell.

5. The performance degradation analyzer in accordance with claim 1, wherein the specific frequency is a frequency suitable for measurement of the reaction resistance in the fuel cell, the operating state sensor detects at least a parameter related to a catalytic activity in the fuel cell, as the parameter indicating the operating state of the fuel cell, the value obtained from the measured AC impedance is the reaction resistance value of the fuel cell, and the corresponding reference value is set to increase with a decrease in catalytic activity.

6. The performance degradation analyzer in accordance with claim 1, wherein the specific frequency is a frequency suitable for measurement of the reaction resistance in the fuel cell, the operating state sensor detects at least one parameter value of an internal temperature of the fuel cell, a pressure of a gas supplied to the fuel cell, and a power generation current of the fuel cell, as the parameter indicating the operating state of the fuel cell, and the value obtained from the measured AC impedance is the reaction resistance value of the fuel cell.

7. The performance degradation analyzer in accordance with claim 1, wherein the specific frequency is a frequency suitable for measurement of the diffusion resistance in the fuel cell, the operating state sensor detects at least a parameter related to a gas diffusion state in the fuel cell, as the parameter indicating the operating state of the fuel cell, the value obtained from the measured AC impedance is the diffusion resistance value of the fuel cell, and the corresponding reference value is set to increase with a decrease in gas diffusion state.

8. The performance degradation analyzer in accordance with claim 1, wherein the specific frequency is a frequency suitable for measurement of the diffusion resistance in the fuel cell, the operating state sensor detects at least one parameter value of a flow rate of the air supplied to the fuel cell, a humidification amount of the air, and a power generation current of the fuel cell, as the parameter value indicating the operating state of the fuel cell, and the value obtained from the measured AC impedance is a diffusion resistance value of the fuel cell.

9. The performance degradation analyzer in accordance with claim 1, wherein the specific frequency is a frequency suitable for measurement of the ohmic resistance, the reaction resistance, and the diffusion resistance of the fuel cell, and the operating state sensor detects at least one parameter value of an internal temperature of the fuel cell, a humidification amount of a gas supplied to the fuel cell, a pressure of the gas supplied to the fuel cell, a power generation current of the fuel cell, and a flow rate of the air supplied to the fuel cell, as the parameter value of the operating state of the fuel cell.

10. A detection unit of detecting performance degradation in a fuel cell, the detection unit:
comparing a corresponding reference value of a detected parameter value of an internal resistance value of the fuel cell with an internal resistance value of the fuel cell obtained from a measured AC impedance of the fuel cell;
wherein the detected parameter value of the internal resistance of the fuel cell is at least one of an ohmic resistance value, diffusion resistance value or reactant resistance value of the fuel cell and indicates an operating state of the fuel cell;
detecting performance degradation in the fuel cell based on a result of the comparison.

11. A performance degradation detection method of detecting performance degradation in a fuel cell, the performance degradation detection method comprising the steps of: (a) measuring an AC impedance of the fuel cell against at least a specific frequency;

(b) detecting a parameter value related to an internal resistance value of the fuel cell, wherein the detected parameter value of the internal resistance value of the fuel cell is at least one of an ohmic resistance value, a diffusion resistance value, and a reactant resistance value and indicates an operating state of the fuel cell;

(c) comparing a corresponding reference value of the detected parameter value of the internal resistance value of the fuel cell with the detected parameter value of the internal resistance value of the fuel cell obtained from the measured AC impedance of the fuel cell; and (d) detecting performance degradation in the fuel cell, based on a result of the comparison.

12. The performance degradation detection method in accordance with claim 11, wherein the specific frequency for measurement of the AC impedance in the step (a) is a frequency suitable for measurement of the ohmic resistance in the fuel cell, the internal resistance value of the fuel cell obtained from the measured AC impedance in the step (c) is the ohmic resistance value of the fuel cell, and the step (b) detects at least one of parameters of an internal temperature of the fuel cell and a humidification amount of a gas supplied to the fuel cell, as the parameter value indicating the operating state of the fuel cell.

13. The performance degradation detection method in accordance with claim 11, wherein the specific frequency for measurement of the AC impedance in the step (a) is a frequency suitable for measurement of the reaction resistance in the fuel cell, the internal resistance value of the fuel cell obtained from the measured AC impedance in the step (c) is the reaction resistance value of the fuel cell, and the step (b) detects at least one of parameters of an internal temperature of the fuel cell, a pressure of a gas supplied to the fuel cell, and a power generation current of the fuel cell, as the parameter value indicating the operating state of the fuel cell.

14. The performance degradation detection method in accordance with claim 11, wherein the specific frequency for measurement of the AC impedance in the step (a) is a frequency suitable for measurement of the diffusion resistance in the fuel cell, the internal resistance value of the fuel cell obtained from the measured AC impedance in the step (c) is the diffusion resistance value of the fuel cell, and the step (b) detects at least one of parameters of a flow rate of the air supplied to the fuel cell, a humidification amount of the air, and a power generation current of the fuel cell, as the parameter value indicating ~ the operating state of the fuel cell.

* * * * *

UNITED STATES PATENT AND TRADEMARK OFFICE
CERTIFICATE OF CORRECTION

| | |
|---|---|
| PATENT NO. | : 8,129,998 B2 |
| APPLICATION NO. | : 11/990128 |
| DATED | : March 6, 2012 |
| INVENTOR(S) | : Nobuo Watanabe et al. |

It is certified that error appears in the above-identified patent and that said Letters Patent is hereby corrected as shown below:

| Column | Line | |
|---|---|---|
| 17 | 42 | Before "performance" delete "detecting" and insert: --said detection unit includes a cup for determining-- |

Signed and Sealed this
Eighth Day of January, 2013

David J. Kappos
*Director of the United States Patent and Trademark Office*